(12) United States Patent
Cheng et al.

(10) Patent No.: US 8,288,802 B2
(45) Date of Patent: Oct. 16, 2012

(54) SPACER STRUCTURE WHEREIN CARBON-CONTAINING OXYNITRIDE FILM FORMED WITHIN

(75) Inventors: Po-Lun Cheng, Kao-Hsiung Hsien (TW); Che-Hung Liu, Tainan Hsien (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 492 days.

(21) Appl. No.: 11/379,226

(22) Filed: Apr. 19, 2006

(65) Prior Publication Data
US 2007/0246751 A1    Oct. 25, 2007

(51) Int. Cl.
*H01L 29/76* (2006.01)
*H01L 29/94* (2006.01)

(52) U.S. Cl. .............. 257/288; 257/410; 257/E21.632; 257/E21.64

(58) Field of Classification Search .............. 257/900, 257/E21.64, 288, 410, E21.632
See application file for complete search history.

(56) References Cited

U.S. PATENT DOCUMENTS

| | | | |
|---|---|---|---|
| 6,812,073 B2 | 11/2004 | Bu | |
| 2003/0020111 A1 | 1/2003 | Bevan | |
| 2004/0063260 A1 | 4/2004 | Bu | |
| 2006/0054934 A1* | 3/2006 | Chen et al. | 257/204 |
| 2006/0121681 A1* | 6/2006 | Nandakumar | 438/302 |
| 2007/0087575 A1* | 4/2007 | Iyer et al. | 438/758 |

* cited by examiner

*Primary Examiner* — Ori Nadav
*Assistant Examiner* — Vernon P Webb
(74) *Attorney, Agent, or Firm* — Winston Hsu; Scott Margo

(57) ABSTRACT

A spacer structure contains a carbon-containing oxynitride film positioned on a gate sidewall and a nitride film covering the carbon-containing oxide film. The carbon-containing oxynitride film has low etch rate so that the spacer structure can have a good profile during etching the carbon-containing oxynitride film.

17 Claims, 15 Drawing Sheets

SPACER STRUCTURE WHEREIN CARBON-CONTAINING OXYNITRIDE FILM FORMED WITHIN

BACKGROUND OF THE INVENTION

1. Field of the Invention

The present invention relates to a spacer structure of semiconductor elements and fabrication method thereof, and more specifically, to a spacer structure with a carbon-containing oxynitride film and fabrication method thereof.

2. Description of the Prior Art

Metal oxide semiconductor (MOS) transistors are in wide use in many electric devices. A MOS transistor has four terminals: the source, the drain, the gate electrode, and the substrate. When a gate voltage greater than a threshold voltage of a MOS transistor is applied to the gate electrode, a channel forms between the source and the drain due to strong inversion. Consequently, the electrical performance of the gate electrode is an important issue in the semiconductor industry. For providing a good electrical performance of the gate electrode, a spacer positioned on the gate sidewall is typically used so that the source and drain or other electric elements can be effectively isolated from the gate electrode.

FIGS. 1-4 are schematic sectional views of fabricating the spacer structure of a MOS transistor according to the prior art. With reference to FIG. 1, a silicon substrate 10 is provided, wherein a gate electrode 12 and a gate insulation film 14 are formed on the surface of the substrate 10. For forming the spacer structure, a first oxide film 16 is formed on the substrate 10 and covering the gate electrode 12, wherein the first oxide film 16 may be a high temperature oxide (HTO) film. Then, a nitride film 18 is deposited on the first oxide film 16, wherein a furnace system is used for introducing bis(tertiarybutylamine)silane (BTBAS) as a precursor to form the nitride film 18.

Referring to FIG. 2, a second oxide film 20 is deposited on the substrate 10, covering the nitride film 18. The second oxide film 20 is typically formed by a chemical vapor deposition (CVD) process or a plasma enhanced chemical vapor deposition (PECVD) process, wherein tetra-ethyl-ortho-silicate (TEOS) is used as the reactant gas to form the second oxide film 20.

With reference to FIG. 3, an etching back process is performed after forming the second oxide film 20 for fabricating a spacer structure of a MOS transistor. Sequentially, a L-shaped spacer 22 and an arc-shaped spacer 24 are formed at the gate sidewall 12a. However, a silicon oxide film has a much higher etching rate than that of a silicon nitride film. For example, the first oxide film 16 which is a HTO film has an etching rate reach to 183.8 angstrom (Å) per minute, thus the second oxide film 20 and the first oxide film 16 are easily over removed which will result in defects to the MOS transistor. As shown in FIG. 4, oxide loss occurs in the arc-shaped spacer 24, and the first oxide film 16 also has an undercut at the side of the L-shaped spacer 22. As a result, it is hard to control the spacer structure of the MOS transistor according to the fabrication of the prior art, which impacts the implant shape of the following formed source and drain structure of the MOS transistor. Therefore, the unexpected oxide loss of the spacer structure may seriously influence the electric performance of the MOS transistor. Accordingly, how to provide low etch-rate oxide films during fabricating a spacer of a MOS transistor is still an important issue to the manufacturer.

SUMMARY OF THE INVENTION

It is therefore a primary objective of the claimed invention to provide a spacer structure with a low etch-rate oxide film and fabrication method thereof to solve the above-mentioned problem.

According to the claimed invention, the spacer structure comprises a first carbon-containing oxynitride film on a gate sidewall and a nitride film covering the carbon-containing oxide film.

According to the claimed invention, the fabrication method of a spacer structure comprises forming a first carbon-containing oxynitride film on a gate sidewall and a nitride film on the first carbon-containing oxynitride film. Then, an etching process is performed to remove portions of the nitride film and the first carbon-containing oxynitride film.

It is an advantage of the claimed invention that the first carbon-containing oxynitride film contains carbon and nitrogen so that the etching selectivity of the first carbon-containing oxynitride film to the nitride film is low and the etching rate of the first carbon-containing oxynitride film is low. Accordingly, a preferable spacer structure profile can be provided according to the claimed invention.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
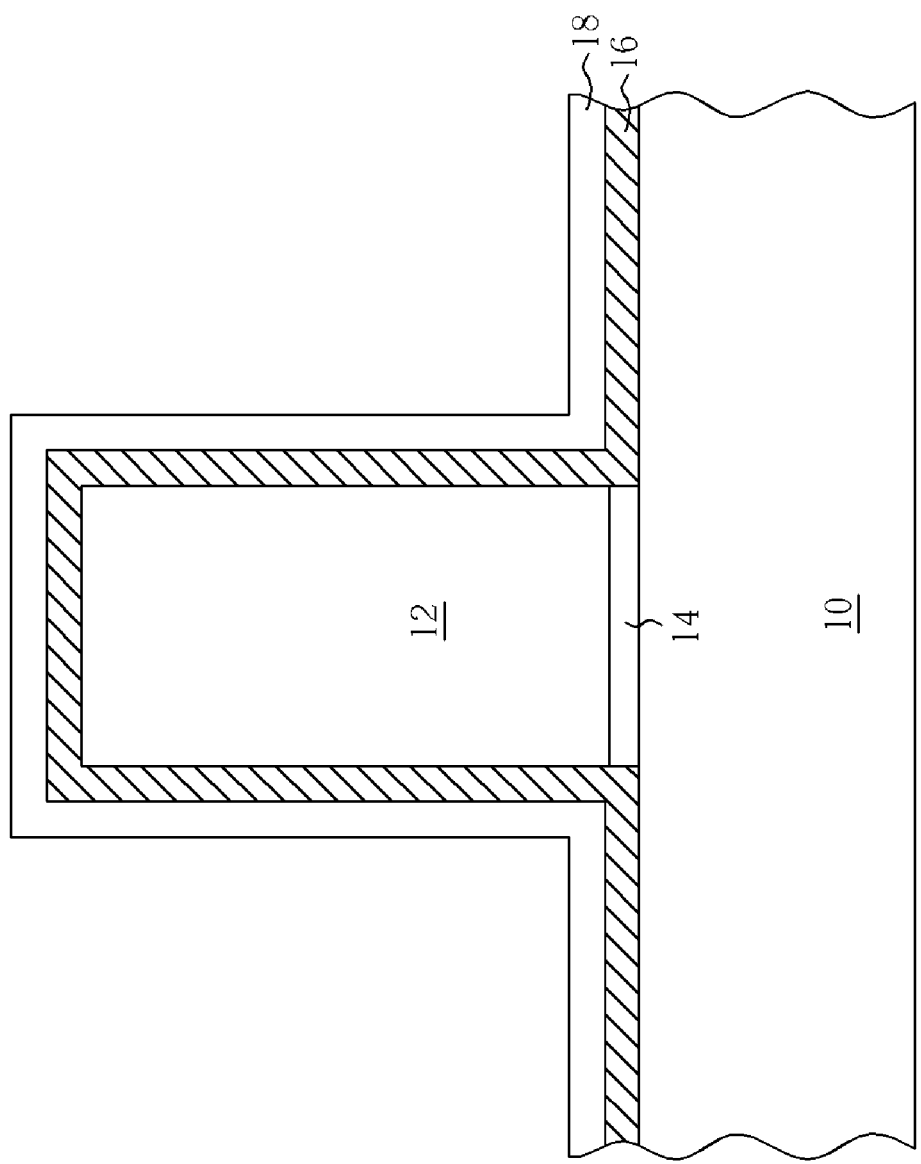
FIGS. 1-4 are schematic sectional views of a MOS transistor according to the prior art.
Figure 2:
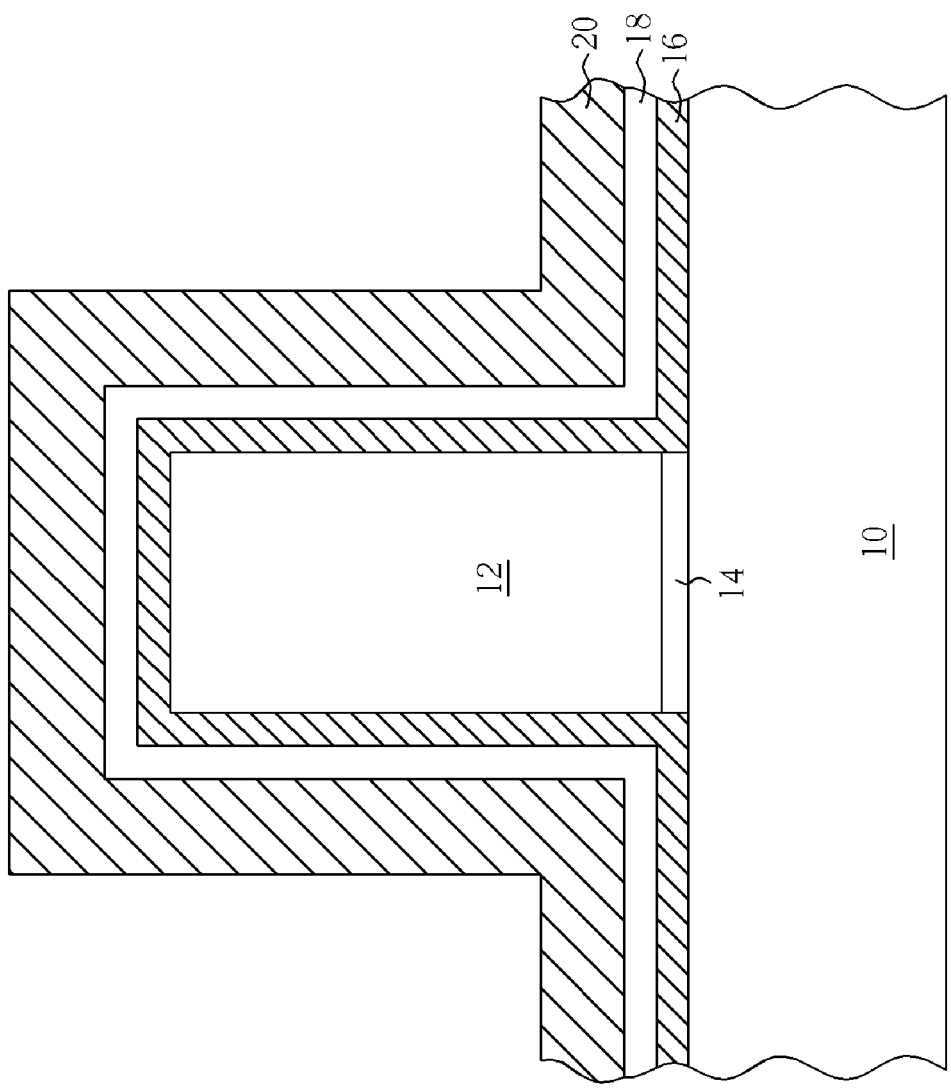
Figure 3:
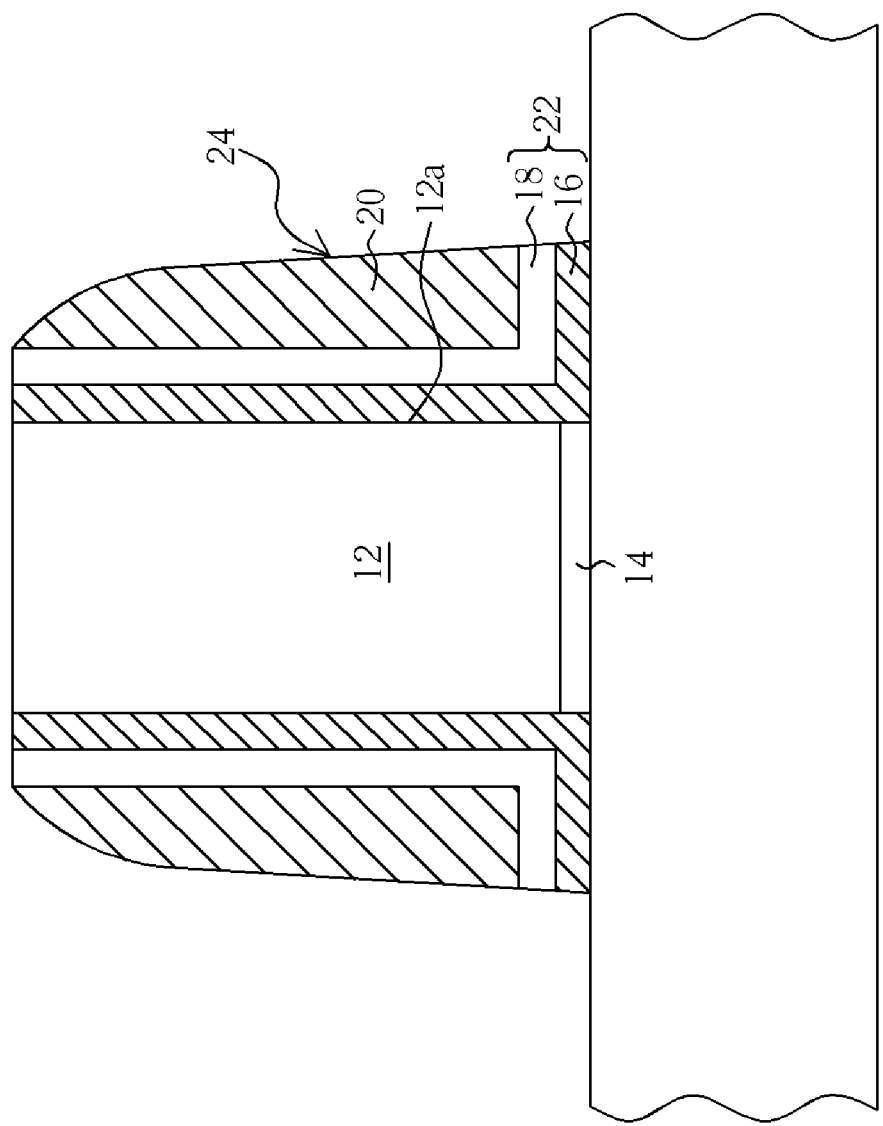
Figure 4:
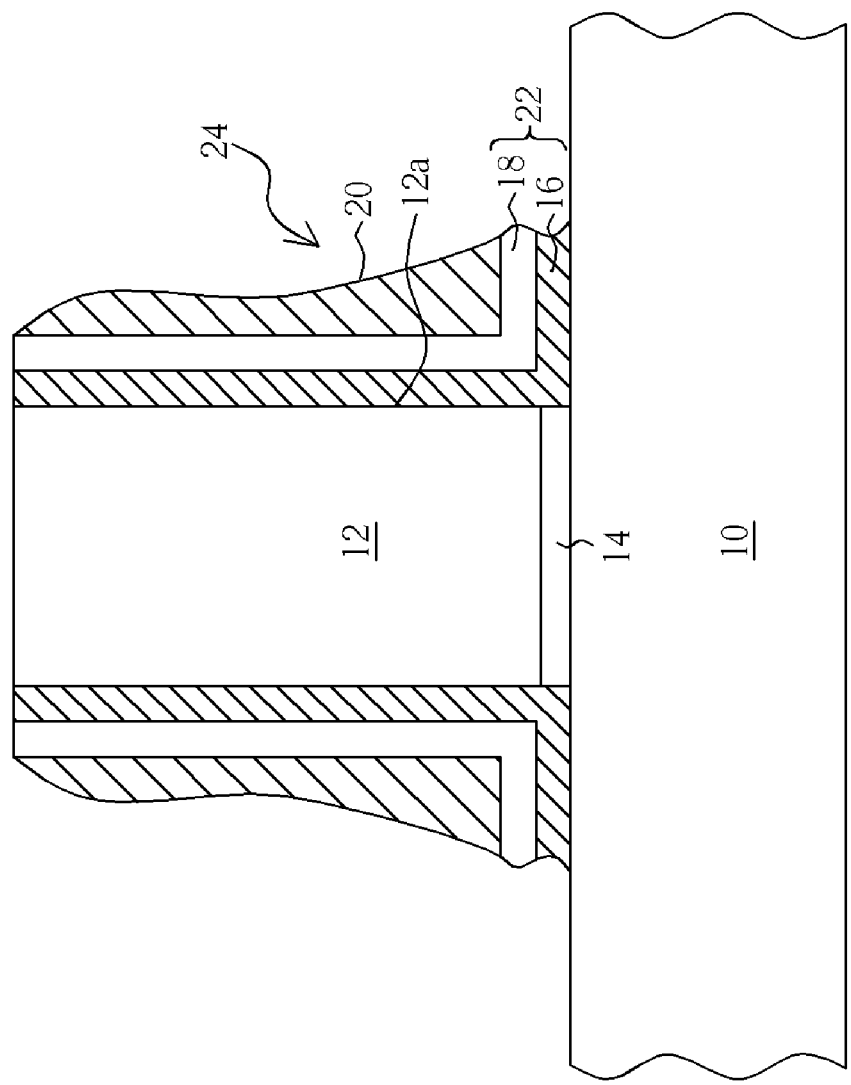
Figure 5:
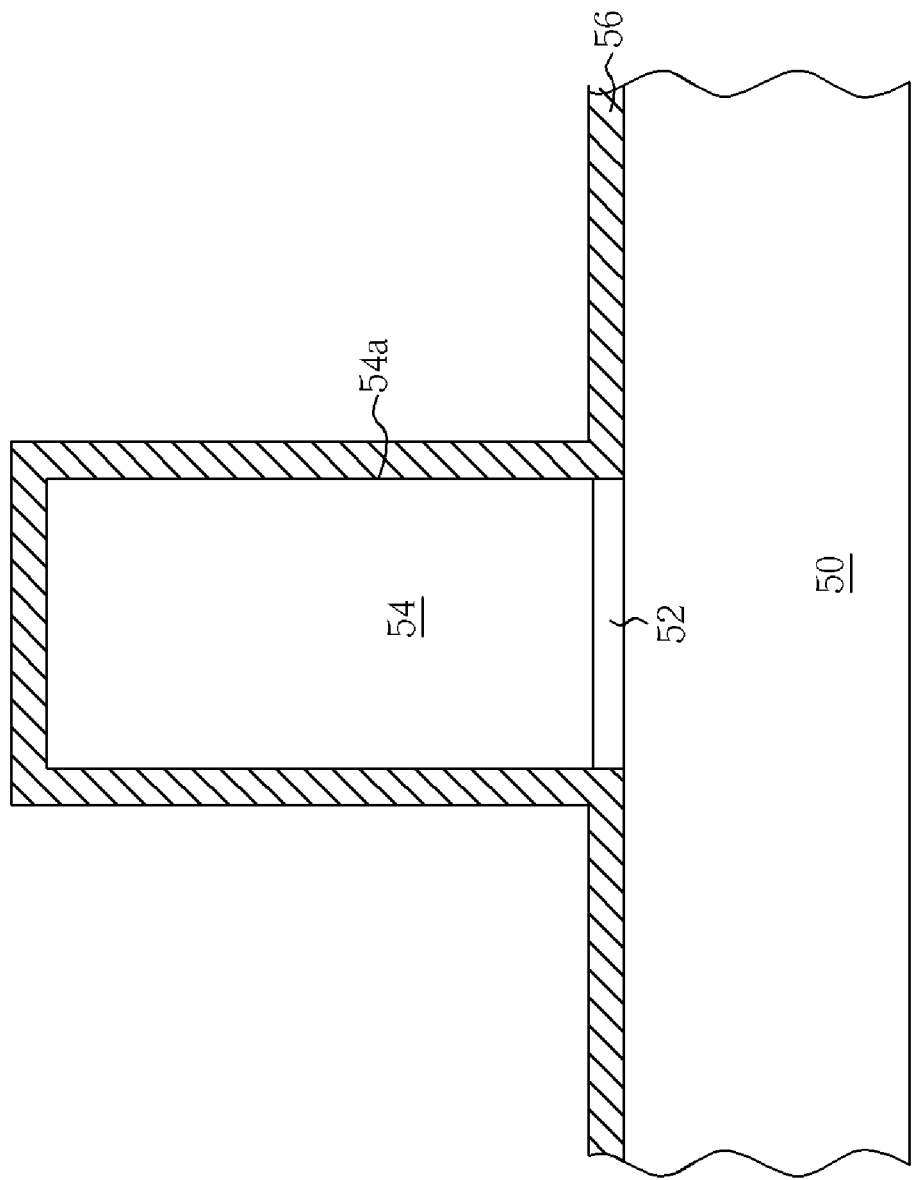
FIGS. 5-9 are schematic sectional views of fabricating a MOS transistor according to a first embodiment of the present invention.

FIGS. 5-10 are schematic sectional views of fabricating a MOS transistor according to a first embodiment of the present invention. Referring to FIG. 5, a silicon substrate 50 is provided, wherein the silicon substrate 50 may be a wafer and further comprises a gate electrode 54 and a gate insulation film 52 thereon. The gate electrode 54 may comprises polysilicon or metal materials. Then, an oxide film 56 is deposited on the surface of the silicon substrate 50, which covering the gate sidewall 54a of the gate electrode 54. The oxide film 56 may be formed with a CVD process, a HTO process, or a thermal oxidation process.

Figure 6:
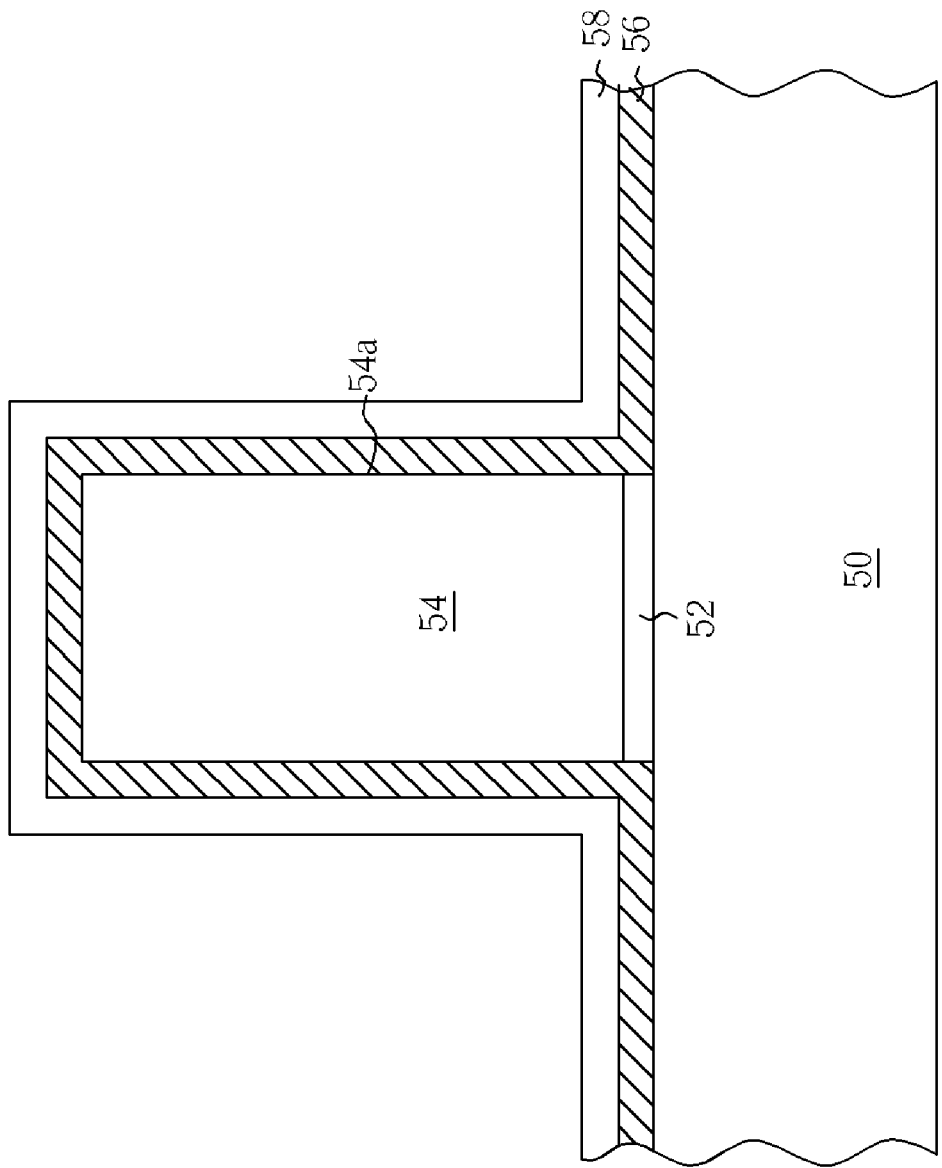
Figure 7:
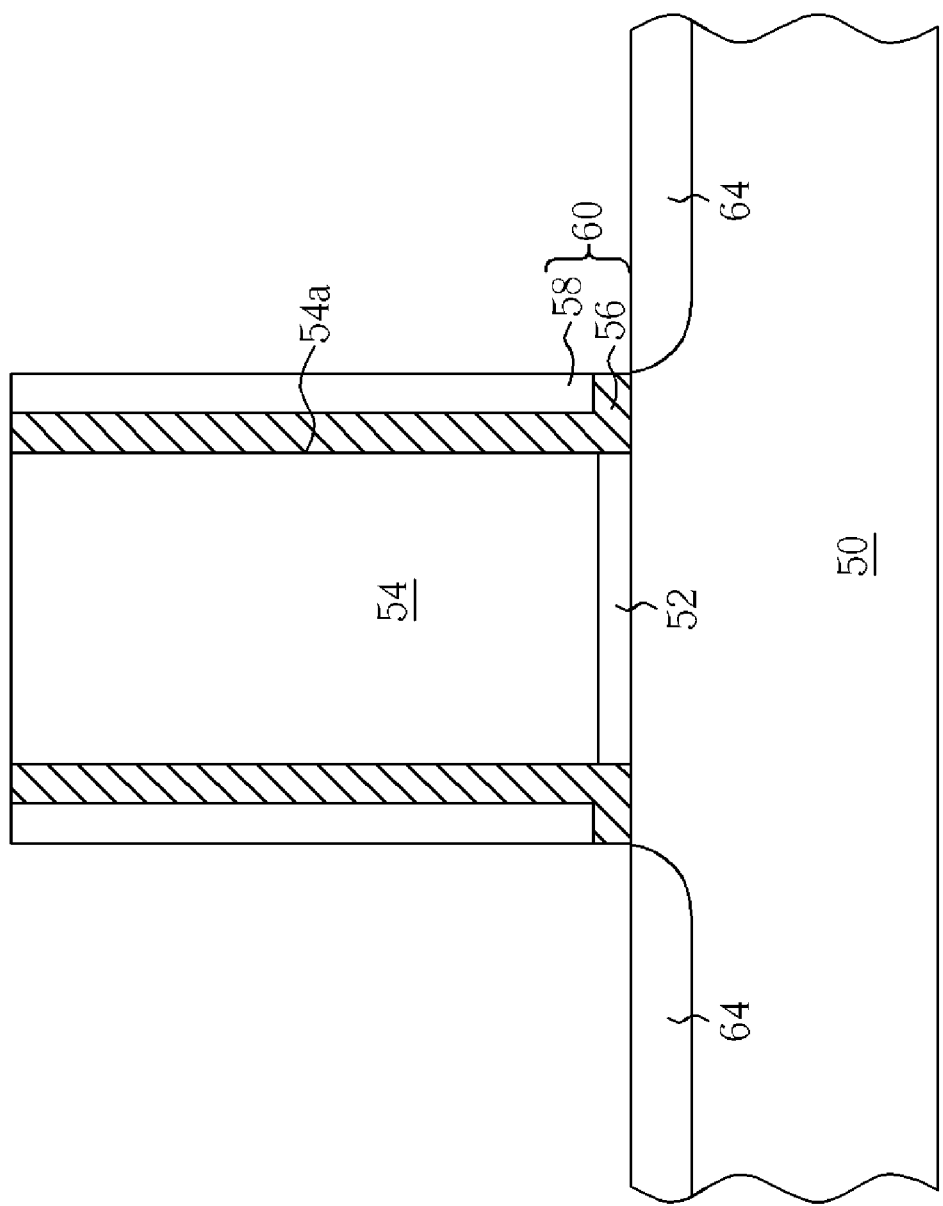

Referring to FIG. 6, a nitride film 58 is deposited on the oxide film 56, wherein the nitride film 58 may be formed by using BTBAS as a precursor. With reference to FIG. 7, an etching process is performed to remove a portion of the oxide film 56 and the nitride film 58 so as to form an offset spacer 60 of the gate electrode 54. Then, a low-energy and low-dose ion implantation process is carried out by taking the gate electrode 54 and the offset spacer 60 as an implant mask so that lightly doped areas 64 are formed in the silicon substrate 50 near its surface.

Figure 8:
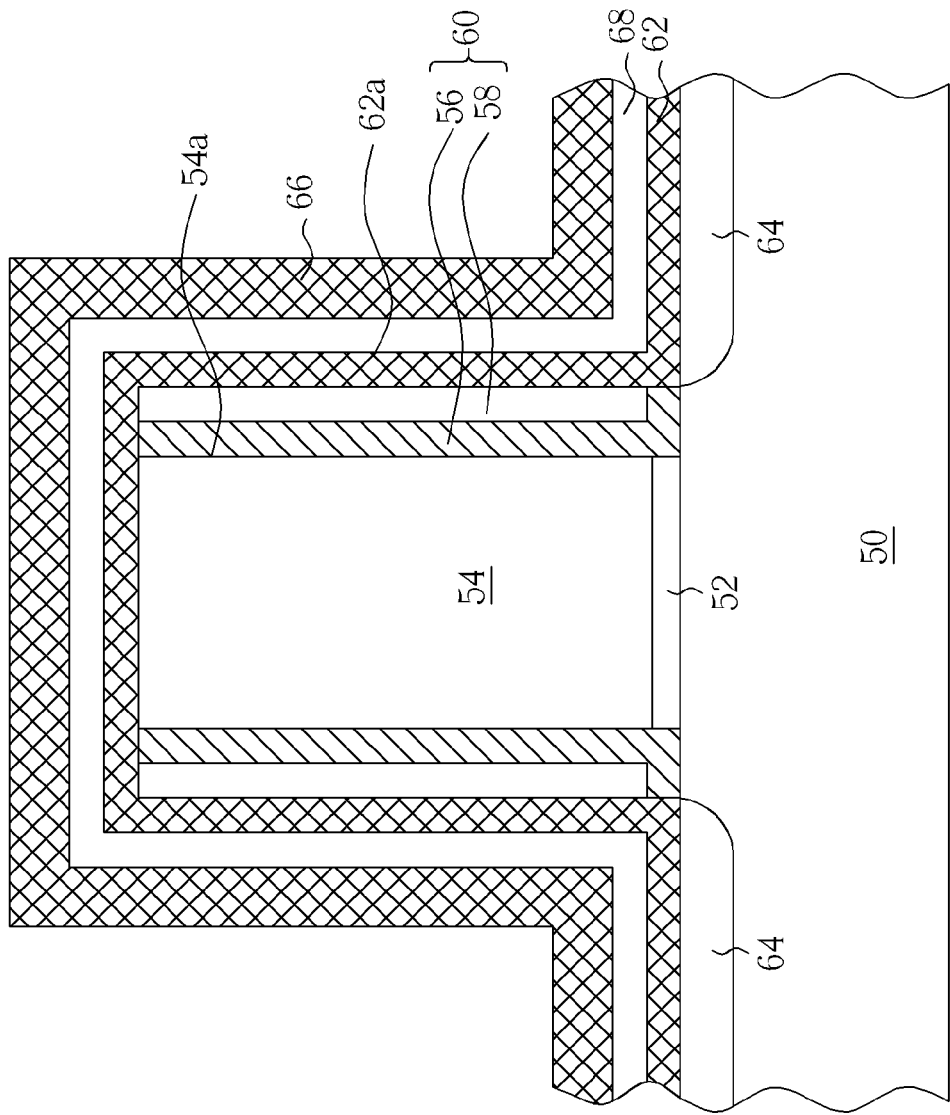

Please refer to FIG. 8. After forming the lightly doped areas 64, the silicon substrate 50 may be transfer to a CVD chamber or a CVD system that comprises a furnace for providing BTBAS. Then, BTBAS is introduced to serve as a precursor to perform an in-situ deposition process to sequentially form a first BTBAS-based oxide 62, a BTBAS-based nitride film 68, and selective a second BTBAS-based oxide film 66 on the substrate 50, wherein the second BTBAS-based oxide film 66 has a larger thickness than the thicknesses of the first BTBAS-based oxide film 62 and the BTBAS-based nitride film 68. Since BTBAS contains nitrogen and carbon atoms, the first and second BTBAS-based oxide films 62, 66 also contains nitrogen and carbon atoms so that they can be defined as a first carbon-containing oxynitride film 62 and a second carbon-containing oxynitride film 66. Furthermore, the BTBAS-based nitride film 68 is a carbon-containing nitride film. As shown in FIG. 8, the BTBAS-based nitride film 68 directly covers the whole top surface of the first BTBAS-based oxide film 62. For example, the BTBAS-based nitride film 68 directly contacts and directly covers a surface 62a of the first BTBAS-based oxide film 62, wherein the surface 62a is in parallel with the sidewall 54a of the gate 54.

The process parameters of the in-situ deposition process are described as below. During forming the first or second carbon-containing oxynitride film 62, 66, the chamber pressure is about 200 torr; the process temperature is about 400-800° C., preferable 500-700° C.; BTBAS introducing rate is about 30-31 sccm; and introducing rate of oxygen-containing gas is about 200 sccm, wherein the oxygen-containing gas comprises oxygen, nitrous oxide (N2O), or nitric oxide (NO). On the other hand, during the deposition of the BTBAS-based nitride film 68, the chamber pressure is about 200 torr; the process temperature is about 675° C.; the introducing rate of BTBAS is about 50 sccm; and the introducing rate of nitrogen-containing gas, such as ammonia ($NH_3$), is about 40 sccm.

Figure 9:
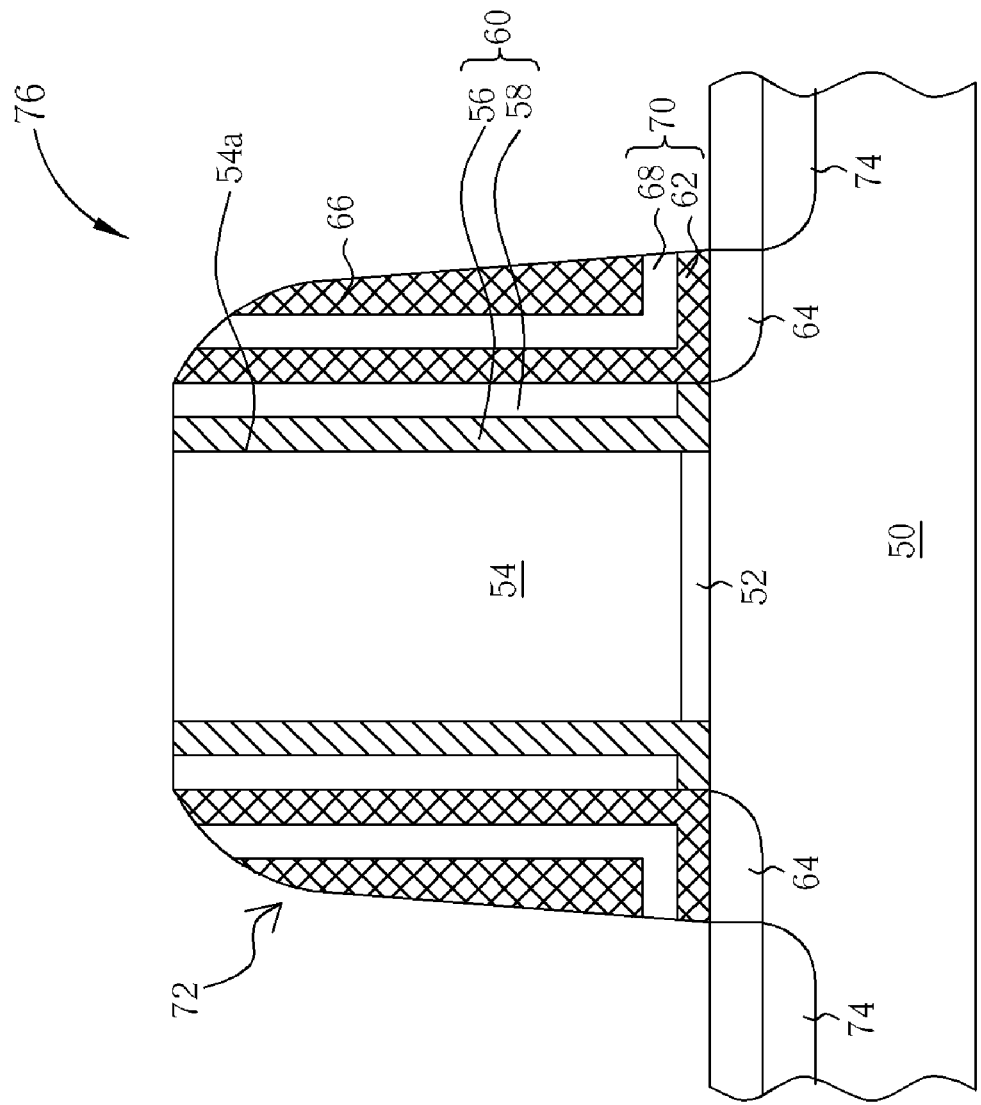

With reference to FIG. 9, an etching back process is performed to remove portions of the second carbon-containing oxynitride film 66, the BTBAS-based nitride film 68, and the first carbon-containing oxynitride film 62 so as to form a L-shaped structure 70 and an arc-shaped structure 72, which compose a spacer structure containing an oxide-nitride-oxide (ONO) structure. As shown in FIG. 9, each of the first carbon-containing oxynitride film 62 and the BTBAS-based nitride film 68 has an L-shaped profile. Then, a high-energy and high dose ion implantation process is progressed to form high doping regions 74 in the silicon substrate 50, wherein the high doping regions 74 serve as source and drain electrodes. Accordingly, the fabrication of the MOS transistor 76 is completed.

Figure 10A:
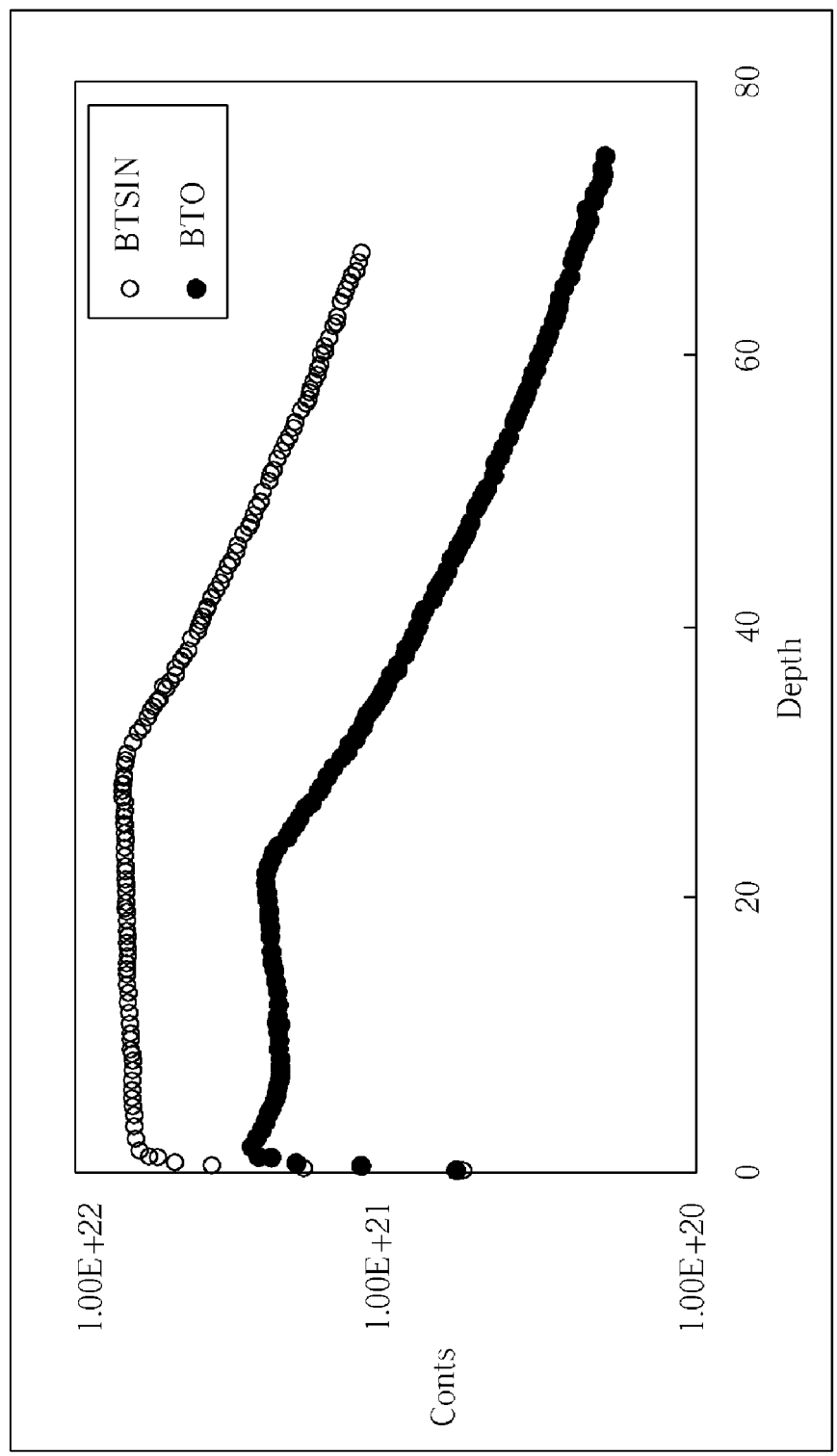
FIG. 10a is a carbon content profile diagram of a BTBAS-based oxide film and a BTBAS-based film shown according to the present invention.
Figure 10B:
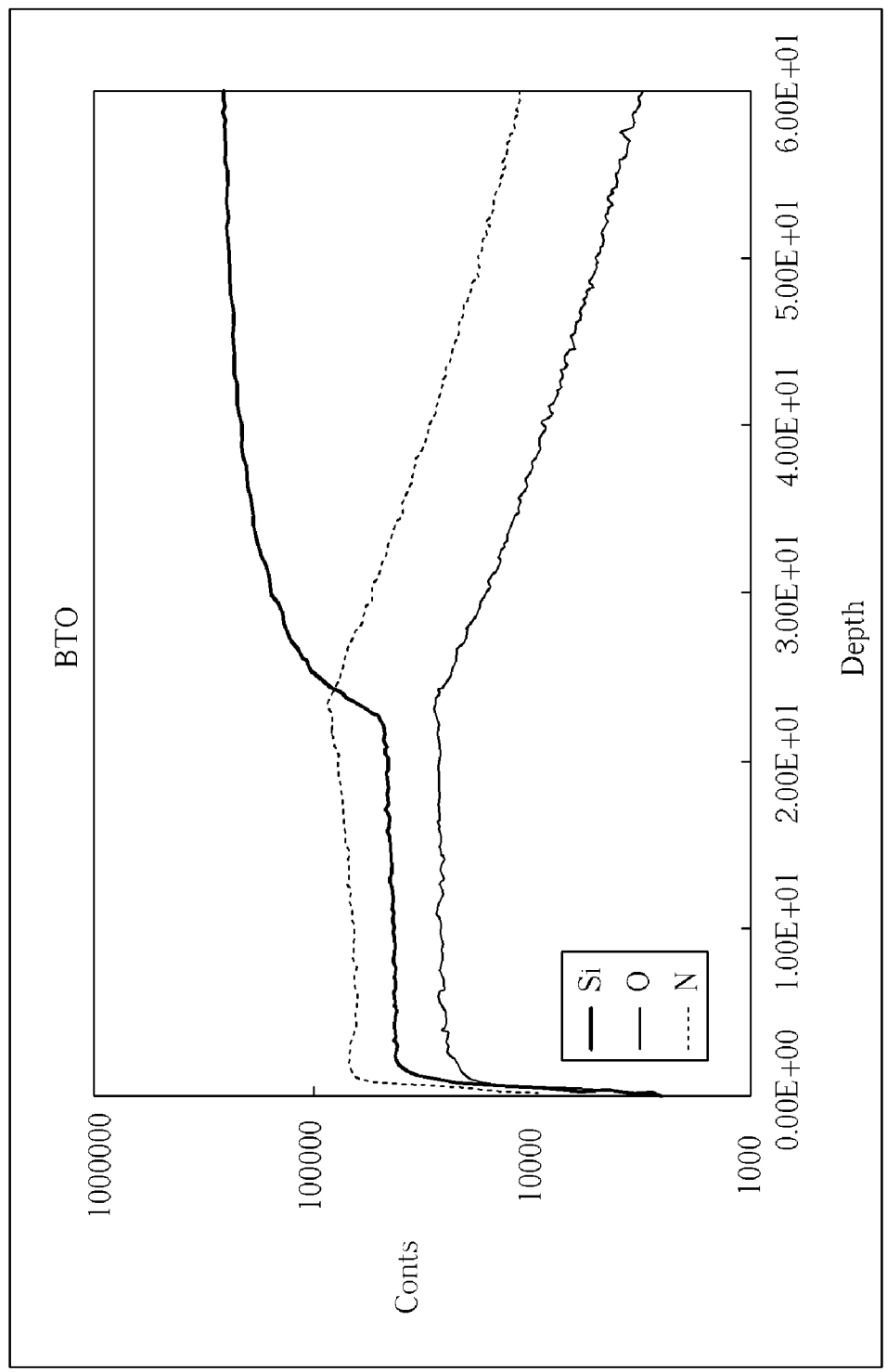
FIG. 10b is an atom content profile diagram of BTBAS-based oxide film according to the present invention.
Figure 11:
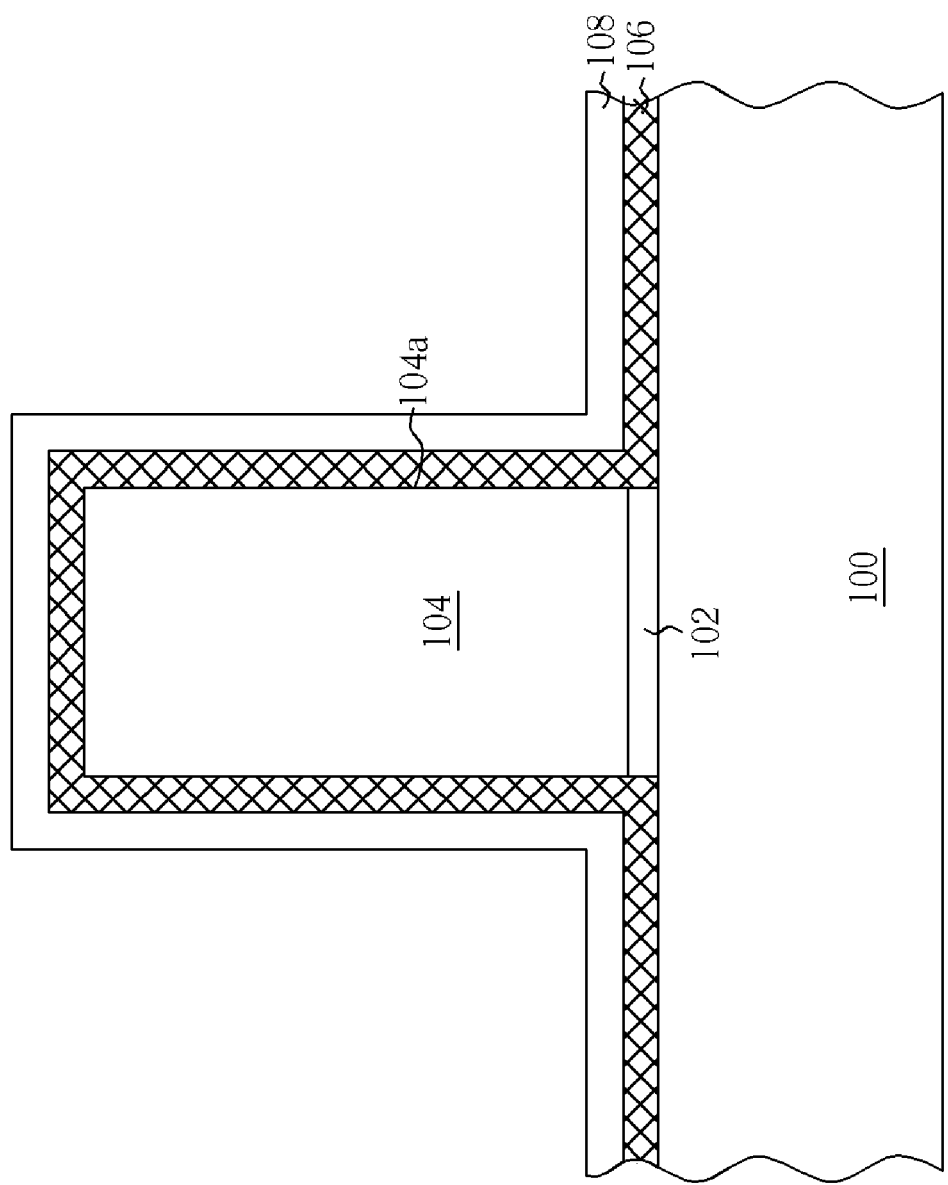
FIGS. 11-14 are schematic sectional views of fabricating a MOS transistor according to a second embodiment of the present invention.

FIG. 10a is a carbon content profile diagram of a BTBAS-based oxide film (BTO, such as the carbon-contain oxynitride film 62) and a BTBAS-based nitride film (BTSIN, such as film 68) according to the present invention while FIG. 10b is an atom content profile diagram of a BTBAS-based oxide film according to the present invention. The vertical axis represents carbon content and the horizontal axis represents the depth. As shown in FIG. 10a, the carbon contents of the BTBAS-based oxide film and BTBAS-based nitride film reach to about 1.00E21 to 1.00E22 atom/$cm^3$. Furthermore, since BTBAS contains nitrogen atoms, the BTBAS-based oxide film is a carbon-containing oxynitride film. As shown in FIG. 10b, the BTBAS-based oxide film contains more nitrogen atoms than oxygen atoms. According to the experimental data, since the BTBAS-based oxide film or carbon-containing oxynitride film has carbon and nitrogen atoms, its etching rate is about 60.6 Å/min, lower than prior art HTO film. Therefore, the first carbon-containing oxynitride film 62 and the second carbon-containing oxynitride film 66 have low etching rate and low etch selectivity to a nitride film since they are fabricated through taking BTBAS as the reactant gas. Accordingly, the L-shaped spacer 70 and the arc-shaped spacer 72 can have good profiles during the etching back process, resulting in good electric performance of the MOS transistor 76.

Furthermore, according to the present invention, the etching rate of the carbon-containing oxynitride films 62, 66 can be decreased through controlling the process parameters during forming the carbon-containing oxynitride films 62, 66. For example, providing low chamber pressure, high process temperature, or providing reactant gas with high BTBAS/$N_2O$ flow ratio can reduce the etching rate of the carbon-containing oxynitride films 62, 66. In addition, decreasing the deposition rate of the carbon-containing oxynitride films 62, 66 can also reduce their etching rate. As a result, the etch selectivity of the carbon-containing oxynitride films 62, 66 to the BTBAS-based nitride film 68 can be adjusted to become lower according to the present invention. Consequently, preferable spacer profile of the MOS transistor 76 can be formed.

Please refer to FIGS. 11-14, which are schematic sectional views of fabricating a MOS transistor according to a second embodiment of the present invention. First, a silicon substrate 100 is provided, and the silicon substrate 100 comprises a gate insulation film 102 on the surface of the silicon substrate 100 and a gate electrode 104 positioned on the gate insulation film 102. Then, a first in-situ deposition process is performed to sequentially form a first oxide film 106 and a first nitride film 108 on the silicon substrate 100, covering the surface of the gate electrode 104 and the gate sidewall 104a. During forming the first oxide film 106 and the first nitride film 108, BTBAS is introduced by a furnace for serving as a precursor or a reactant gas. Therefore, the first oxide film 106 is a carbon-containing oxynitride film and the first nitride film 108 is a carbon-containing nitride film. However, in other embodiment, the first oxide film 106 and the first nitride film 108 may be formed by different deposition processes in different chambers provided that each of the deposition processes can fabricate the first oxide film 106 containing carbon and nitrogen atoms and the first nitride film 108 containing carbon atoms or that BTBAS is used as the reactant gases during fabricating the first oxide film 106 and the first nitride film 108 individually.

When depositing the first oxide film 106, the chamber pressure is about 200 torr; the process temperature is about 500-700° C.; BTBAS introducing rate is about 30-31 sccm; and introducing rate of oxygen-containing gas, such as $N_2O$, is about 200 sccm. In addition, during the deposition of the first nitride film 108, the chamber pressure is about 200 torr; the process temperature is about 675° C.; introducing rate of BTBAS is about 50 sccm; and the introducing rate of nitrogen-containing gas, such as $NH_3$, is about 40 sccm.

Figure 12:
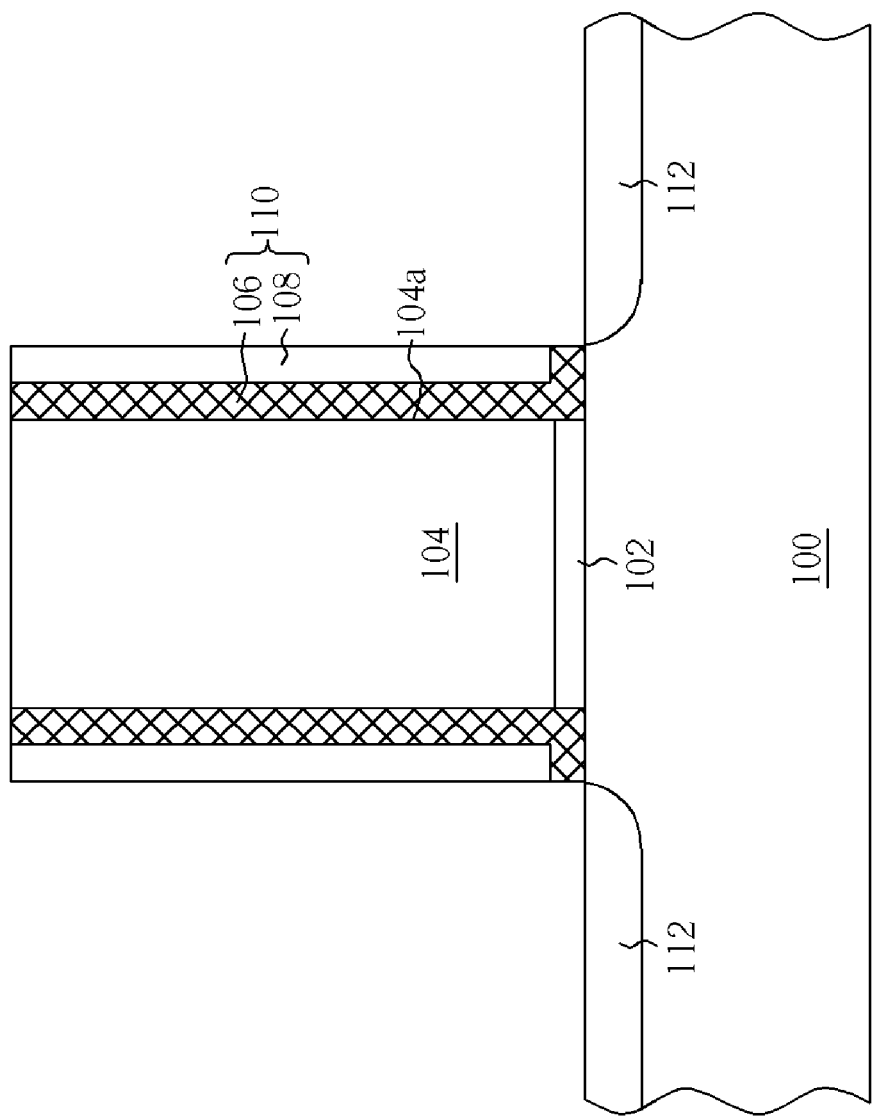

Please refer to FIG. 12. An etching back process is performed to remove a portion of the first oxide film 106 and the first nitride film 108 so as to form an offset spacer 110. Then, a low-energy and low-dose ion implantation process is performed by taking the gate electrode 104 and the offset spacer 110 as an implant mask so that lightly doped areas 112 are formed in the silicon substrate 100 near its surface.

Figure 13:
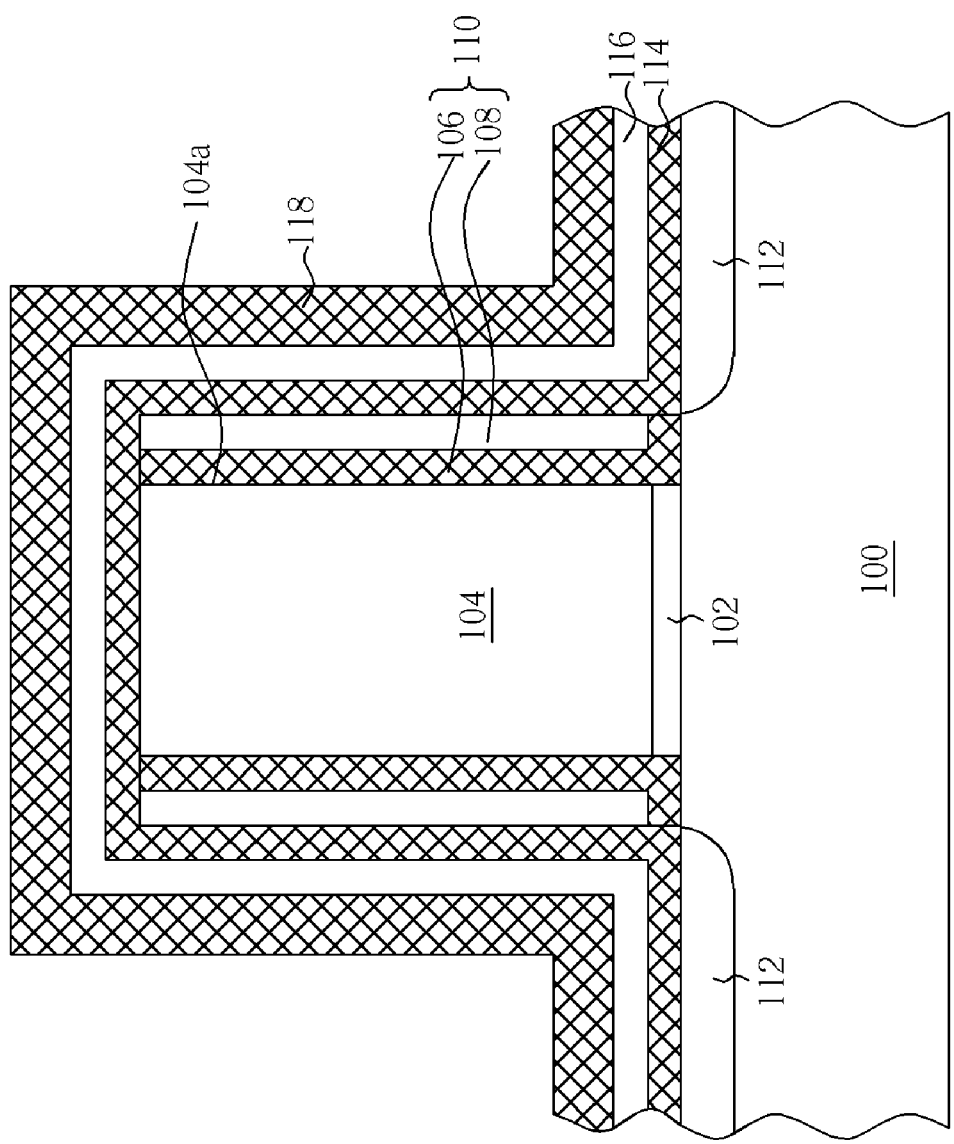

With reference to FIG. 13, a second in-situ deposition process is performed to sequentially form a second oxide film 114, a second nitride film 116, and selectively a third oxide film 118 on the silicon substrate 100, the gate electrode 104 and the offset spacer 110, wherein the second in-situ deposition process may be performed by a single wafer BTBAS system by taking BTBAS as the precursor or the reactant gas. The process parameters may be similar to that of the first in-situ deposition process. Since BTBAS are utilized as the reactant gas of the second in-situ deposition process, the second and third oxide films 114, 118 comprise carbon-containing oxynitride and the second nitride film 116 is a carbon-containing nitride film.

Figure 14:
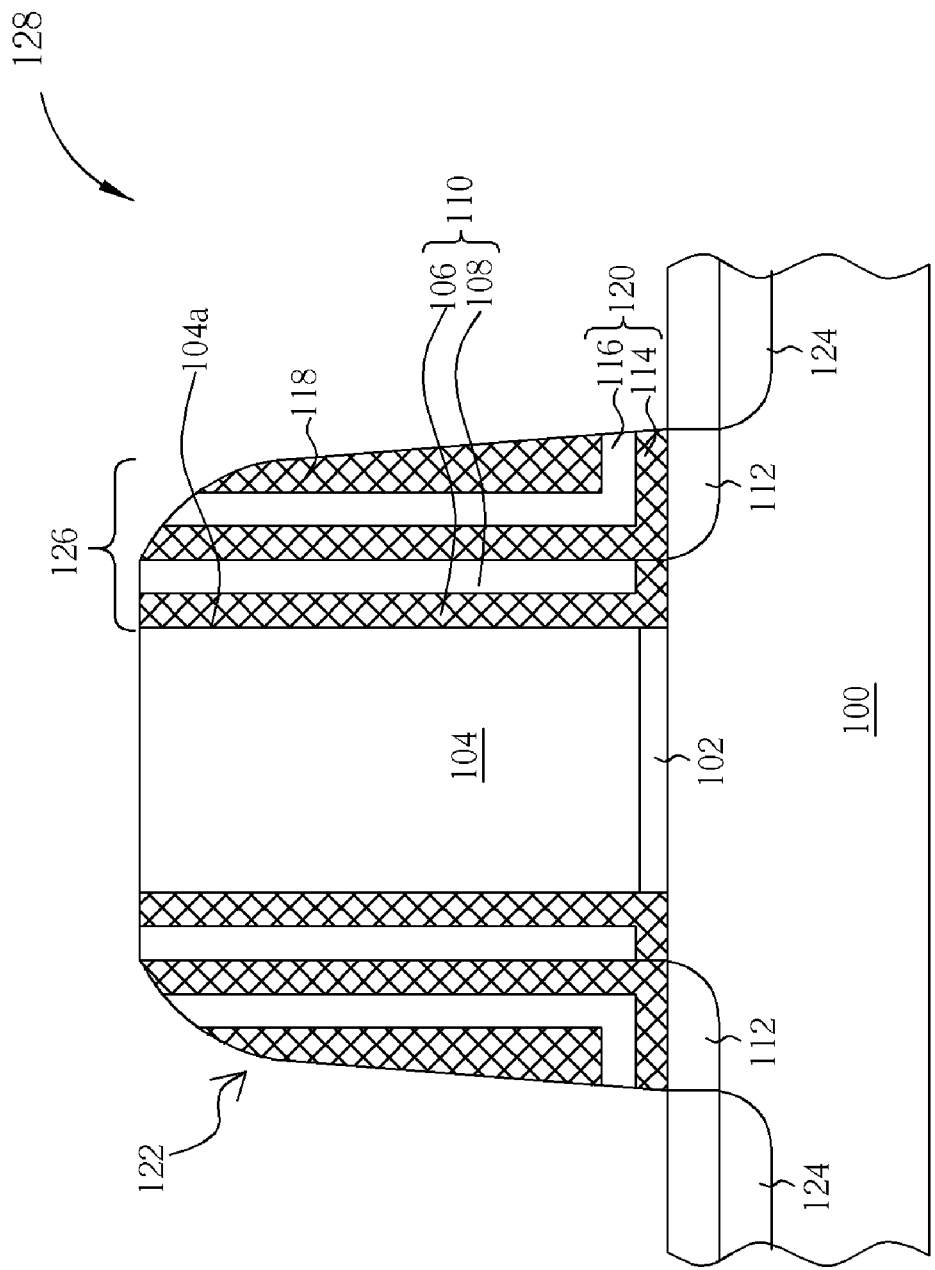

Referring to FIG. 14, an etching process is performed to etch back the second oxide film 114, the second nitride film 116, and the third oxide film 118 so as to form a L-shaped structure 120 and an arc-shaped structure 122, wherein the offset spacer 110, the L-shaped structure 120 and the arc-shaped structure 122 compose a spacer structure 126 of the MOS transistor. Then, a high-energy and high dose ion implantation process is progressed to form high doping regions 124 in the silicon substrate 100, wherein the high doping regions 124 serve as source and drain electrodes. Consequently, a MOS transistor 128 is fabricated.

Since the second oxide film 114 and the third oxide film 118 comprise carbon-containing oxynitride, their etching rates are low enough to obtain preferable profiles for the L-shaped structure 120 and the arc-shaped spacer 122. Therefore, the implant shape of the high doping regions 124 of the MOS transistor 128 is preferable and which can provide a good electric performance to the MOS transistor 128.

It should be noted that the second and third oxide films 114, 118 have to comprise carbon and nitrogen atoms for reducing their etching rate and etch selectivity. Therefore, the second in-situ deposition process can be replaced by three individually deposition processes for forming the second oxide film 114, the second nitride film 116, and the third oxide film 118 respectively provided that BTBAS is used as the reactant gases of the individual deposition processes. Furthermore, the second and third oxide films 114 and 118 may also be formed by other processes or with various precursor or reactant gas provided that both of the second and third oxide films 114, 118 comprise carbon and nitride atoms.

Furthermore, the third oxide film 118 may be omitted or have a small thickness so as to be etched as another L-shaped structure in other embodiments. In addition, the third oxide film 118 may serve as a liner that will be removed after forming all the elements of the MOS transistor 128.

In contrast to the prior art, the present invention provides a fabrication method of the spacer structure with at least a carbon-containing oxynitride film so that the profile of the spacer structure formed through an etching process can be preferable. As a result, a good implant shape of source/drain electrode may be formed. In addition, the in-situ deposition of forming the L-shaped structure or the offset spacer of the spacer structure can effectively reduce thermal budget and improve throughput of the fabrication process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A spacer structure comprising:
   a nitride film positioned on a gate sidewall;
   a first carbon-containing oxynitride film disposed between the gate sidewall and the nitride film; and
   a second carbon-containing oxynitride film covering the nitride film.

2. The spacer structure of claim 1, wherein the nitride film is a carbon-containing nitride film.

3. The spacer structure of claim 1, wherein the spacer structure further comprises an offset spacer positioned between the gate sidewall and the first carbon-containing oxynitride film.

4. The spacer structure of claim 3, wherein the offset spacer comprises an oxide film.

5. The spacer structure of claim 4, wherein the oxide film of the offset spacer is a third carbon-containing oxynitride film.

6. The spacer structure of claim 4, wherein the offset spacer further comprises a nitride film between the oxide film of the offset spacer and the first carbon-containing oxynitride film.

7. The spacer structure of claim 6, wherein the nitride film is a carbon-containing nitride film.

8. A metal-oxide-semiconductor (MOS) transistor structure comprising:
   a gate electrode positioned on a substrate;
   a source and drain positioned in the substrate near two sides of the gate electrode;
   a gate insulation film positioned between the gate electrode and the silicon substrate; and
   a spacer structure positioned on the sidewall of the gate electrode, the spacer structure comprising:
      an offset spacer positioned on the sidewall of the gate electrode; and
      a L-shaped structure covering the offset spacer comprising:
         a nitride film covering the surface of the offset spacer;
         a first carbon-containing oxynitride film disposed between the surface of the offset spacer and the nitride film; and
         a second carbon-containing oxynitride film covering the nitride film.

9. The MOS transistor structure of claim 8, wherein the nitride film is a carbon-containing nitride film.

10. The MOS transistor structure of claim 8, wherein the offset spacer comprises an oxide film.

11. The MOS transistor structure of claim 10, wherein the oxide film of the offset spacer is a third carbon-containing oxynitride film.

12. The MOS transistor structure of claim 10, wherein the offset spacer further comprises a nitride film between the oxide film of the offset spacer and the first carbon-containing oxynitride film.

13. The MOS transistor structure of claim 12, wherein the nitride film is a carbon-containing nitride film.

14. The spacer structure of claim 1, wherein the first carbon-containing oxynitride film and the nitride film respectively have an L-shaped profile.

15. The MOS transistor structure of claim 8, wherein each of the first carbon-containing oxynitride film and the nitride film has an L-shaped profile.

16. The spacer structure of claim 1, wherein the nitride film directly contacts and directly covers a surface of the first carbon-containing oxynitride film, and the surface of the first carbon-containing oxynitride film is in parallel with the gate sidewall.

17. The MOS transistor structure of claim 8, wherein the nitride film directly contacts and directly covers a surface of the first carbon-containing oxynitride film, and the surface of the first carbon-containing oxynitride film is in parallel with the sidewall of the gate electrode.

* * * * *